Aug. 10, 1965 M. J. RELIS 3,200,341

CAPACITOR CHARGING AND DISCHARGING DEVICE

Filed Dec. 12, 1960

INVENTOR.
MATTHEW J. RELIS

BY

Alfred V. Musumeci

AGENT

United States Patent Office 3,200,341
Patented Aug. 10, 1965

3,200,341

CAPACITOR CHARGING AND DISCHARGING DEVICE

Matthew J. Relis, Fair Lawn, N.J., assignor to Burroughs Corporation, Detroit, Mich., a corporation of Michigan Filed Dec. 12, 1960, Ser. No. 75,273
4 Claims. (Cl. 328—200)

The invention relates generally to devices for charging and discharging a capacitor, and more particularly to circuitry which provides a capacitor discharge path whose impedance is of the same order of magnitude as that of the charging path.

In the case of pulse amplifiers having a capacitor in their output stage, disadvantages may arise due to the fact that charge and discharge rates of the output capacitor are dissimilar. Common types of pulse amplifiers having a capacitor in their output stage are the plate-loaded type and the cathode-follower type. In pulse amplifiers of the plate-loaded type an input signal cutting the tube off will cause the load capacitor to charge through the plate load resistor. When the input signal turns the tube on, the load capacitance is discharged through the effective resistance of the tube, which is usually much smaller in magnitude than the plate load resistor. This results in a capacitor discharge rate which is much faster than the charging rate. The response in the output stage, is therefore, not a symmetrical function and does not correspond to the input.

In pulse amplifiers of the cathode-follower type similar disadvantages may be present due to nonuniformity between charge and discharge rates of the load capacitor. The situation is reversed, however, in the cathode-follower type amplifier in that the load capacitor charges through the tube and discharges through the load resistor.

The present invention combines in one circuit the favorable features of plate-loaded and cathode-follower type pulse amplifiers and eliminates the aforementioned undesirable features of both by providing for uniform charge and discharge rates of a load circuit capacitor. This is accomplished by the provision of novel circuit means which offer to a load capacitor alternative charge and discharge paths.

It is, therefore, an object of the present invention to provide circuit means to maintain uniformity between rates of charging and discharging of an output capacitor.

It is a further object of the present invention to provide a pulse amplifier having an output stage whose voltage wave form is symmetrical.

It is a further object of the present invention to provide a pulse amplifier with a capacitive output stage having improved response to an input.

It is a further object of the present invention to combine in one circuit the favorable features of plate-loaded and cathode-follower pulse amplifiers while avoiding some attendant disadvantages.

Briefly, in accordance with the foregoing, the present invention may be said to comprise two vacuum tube triodes, a capacitor, and circuit means enabling said capacitor to charge through one of said vacuum tube triodes and to discharge through the other. The triodes have their plates connected to a common source of positive potential, and their cathodes connected to ground. The first of said two triodes is of the plate-loaded type and has a load resistor in its plate circuit. The second of said two triodes is of the cathode-follower type and has a load resistor and load capacitor connected in parallel in its cathode circuit. A resistor, or alternatively a diode, connects the cathode of the cathode-follower stage to the plate of the plate-loaded stage. The grid of the cathode-follower stage is also connected to the plate of the plate-loaded stage and an input is applied to the grid of the plate-loaded stage. The input applied to the grid of the plate-loaded triode determines which of the tubes is to conduct and which is to be nonconductive. When the plate-loaded triode is turned on the cathode-follower triode is rendered nonconductive; an input pulse cutting off current flow in the plate-loaded triode will operate to cause the cathode-follower triode to conduct.

In operation, the capacitor in the cathode follower charges through the cathode-follower triode when that tube is conducting, and discharges through the plate-loaded triode during its period of conduction. When a positive-going input is applied to the grid of the plate-loaded stage, that stage begins to conduct and cuts off conduction in the cathode-follower stage. The charged capacitor in the cathode-follower stage must now find a discharge path. Without the provision of a connection between the cathode of the cathode-follower stage and the plate of the plate-loaded stage the capacitor would have to discharge through the resistor in the cathode follower, and do so at a much slower rate than the rate at which it charged. The connection between the cathode-follower stage cathode and the plate circuit of the plate-loaded stage makes it possible for the capacitor to discharge through this path and through the plate-loaded triode, and said discharge will be accomplished at a rate similar to the rate of charge.

Although, in the foregoing, this invention has been described in terms of vacumm tube triodes, it is to be understood that other equivalent signal translating devices may be used without departing from the scope of the present invention.

The present invention also provides a flip-flop circuit embodying the foregoing principles of operation.

A better understanding of the present invention may be had by reference to the drawings and the detailed description thereof which follows, wherein similar reference characters refer to similar parts throughout the several figures of the drawings.

Figure 1:
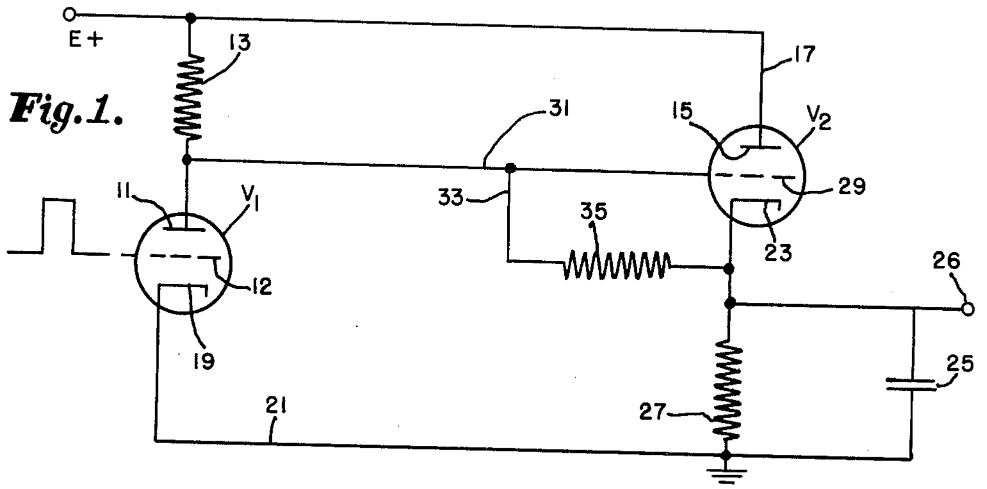
FIG. 1 is a schematic diagram illustrating a pulse amplifier in accordance with the present invention.

Referring now to FIG. 1, $V_1$ and $V_2$ are vacuum tube triodes. The plate 11 of tube $V_1$ is connected to a source of positive potential +E through a resistor 13. The plate 15 of tube $V_2$ is connected to the same source of of positive potential +E through a lead 17. A lead 21 connects the cathode 19 of tube $V_1$ to a source of fixed reference potential shown in the diagram as ground. The cathode 23 of tube $V_2$ is connected to ground through the parallel network comprising capacitor 25 and resistor 27. The grid 29 of tube $V_2$ connects to the plate 11 of tube $V_1$ through a lead 31. Both the plate 11 of tube $V_1$ and the grid 29 of tube $V_2$ are connected to the parallel network comprising resistor 27 and capacitor 25 and to the cathode 23 of the tube $V_2$ through leads 31 and 33 and through the resistor 35. Lead 26 is an output tap to a load.

In order to describe the operation of the circuit it may initially be assumed that tube $V_2$ is conducting and that tube $V_1$ is off. During the conductive portion of the operation of tube $V_2$ the capacitor 25 charges, its maximum level of charge being determined by the magnitude of the positive-potential source +E. When a positive-going input is applied to the grid 12 of tube $V_1$, $V_1$ begins to conduct. This causes the voltage of the plate 11 of tube $V_1$ to go in a negative direction. This negative-going potential is transmitted through lead 31 to the grid 29 of tube $V_2$ thereby cutting tube $V_2$ off. At this point the capacitor 25 is fully charged and must find a path of discharge. In the absence of resistor 35 connecting the capacitor with plate 11, the capacitor would discharge through resistor 27. Resistor 27 is of such a magnitude that discharge of the capacitor 25 through it would be at a rate much slower than the rate of charging. Decreasing the magnitude of resistor 27 would bring the rates of charge and discharge closer together, but it would introduce the disadvantage of increasing the power drawn by the tube and, therefore, increase plate dissipation. If the application is one in which the tube $V_2$ is normally conducting, this tends to increase plate dissipation further, and make the expedient of lowering the magnitude of resistor 27 more disadvantageous.

The resistor 35 is introduced in order to supply a path through which capacitor 25 may discharge at a more rapid rate. With the provision of resistor 35, capacitor 25 may now find a discharge path through resistor 35, leads 33 and 31, tube $V_1$ and lead 21.

After the capacitor 25 has completely discharged, a negative-going input applied to grid 12 will cause the tube $V_1$ to cease conducting. This causes a positive-going voltage on the plate 11 which is transmitted through lead 31 to the grid 29 of tube $V_2$, thereby causing tube $V_2$ to commence conducting and capacitor 25 to charge.

The value of resistor 35 is significant since resistor 35 together with the effective impedance of the tube $V_1$ make up the major portion of the impedance in the discharge path of capacitor 25. Resistor 35 is chosen to have a value which, together with the value of the impedance of tube $V_1$, is small compared with resistor 27. In a typical example, where the tubes $V_1$ and $V_2$ are type 5965, the resistors 13 and 27 may have a value of 50,000 ohms each and resistor 35 may have a value of 10,000 ohms.

When a positive-going pulse from the plate 11 of tube $V_1$ is applied to the grid 29 of tube $V_2$ and the tube $V_2$ commences to conduct, the presence of resistor 35 may have a deleterious effect. During this portion of the cycle when a positive-going pulse is applied to grid 29 of the tube $V_2$ it would be advantageous for resistor 35 to have a very high value. This is true because the presence of resistor 35 creates a connection between cathode 23 and grid 29 thereby tending to bring the potential of cathode 23 closer to the potential of grid 29. This decreases the effectiveness of a positive-going pulse on grid 29 to make tube $V_2$ conduct.

Conversely, when $V_2$ ceases to conduct and the discharge of capacitor 25 requires a path to the plate 11 of tube $V_1$, it would be preferable for resistor 35 to have a lower value to facilitate capacitor discharge.

Figures 2, 3:
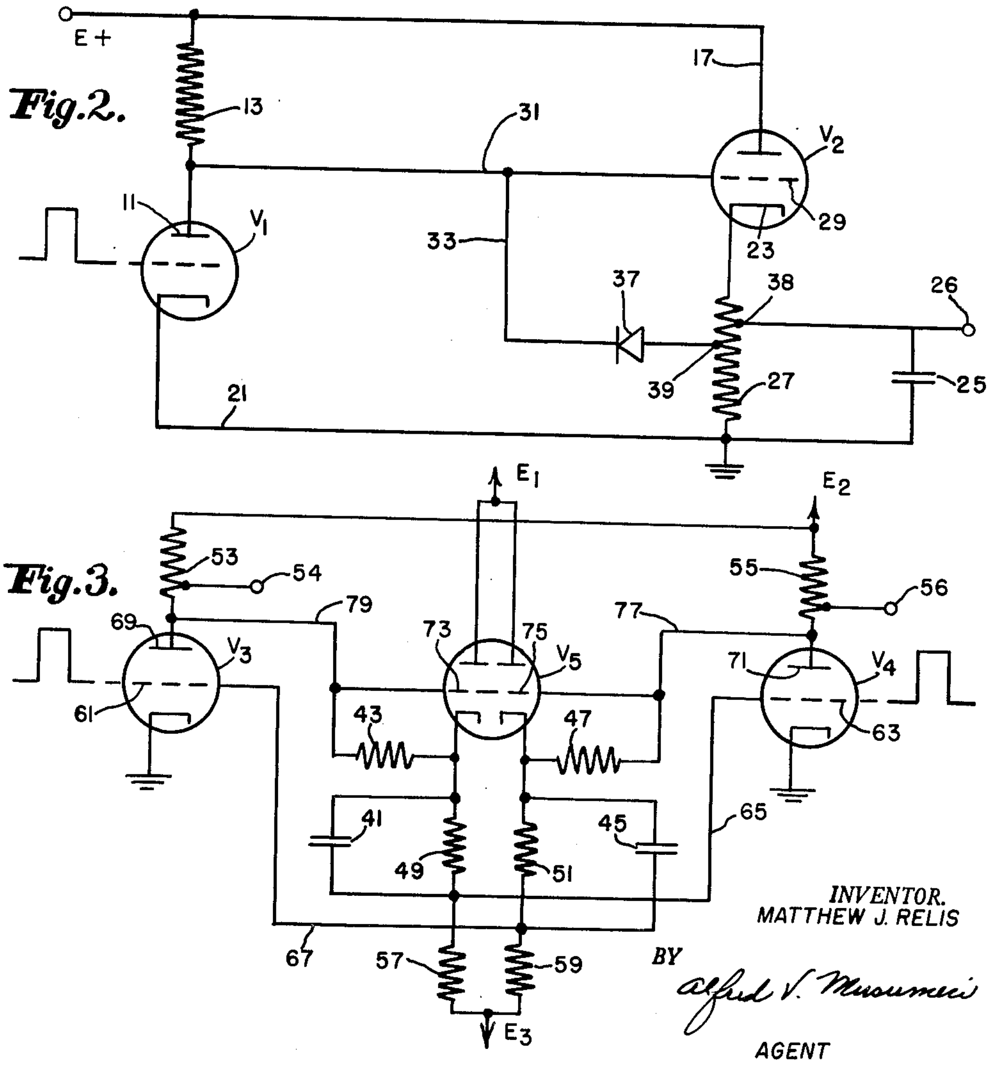
FIG. 2 is a schematic diagram showing an alternative form of practicing the present invention.
FIG. 3 is a schematic diagram of a flip-flop circuit embodying the concepts of the present invention.

The aforementioned requirement is ideally met by the introduction of diode 37 to replace resistor 35 as shown in FIG. 2. Diode 37 permits conduction in the direction from the capacitor 25 to the plate 11, but does not permit conduction in the opposite direction. Diode 37, therefore, offers a low resistance discharge path to capacitor 25 but does not permit current flow from grid 29 to cathode 23 thereby maintaining the potential difference between them.

A further refinement is desirable when diode 37 is used. This involves returning the anode of diode 37 to a tap on the cathode load resistor 27 at point 39. This insures that diode 37 is cut off except when the grid drops below the cathode by more than the normal bias which exists when the cathode follower is fully conducting. If the diode were returned directly to the cathode 23, it might tend to short the cathode to the grid during the fully conducting condition of $V_2$, rendering it ineffective as a cathode follower. This situation might occur when the potential on the cathode reached a relatively positive value tending to overcome the reverse bias of the diode. Connecting the anode of diode 37 to a point on resistor 27 would cause additional resistance to be inserted in the discharge path of capacitor 25, if capacitor 25 remained connected directly to cathode 23. However, the amount of additional resistance would be relatively small. In a typical circuit it might have a value of 500 ohms.

An alternative to this arrangement would be to connect capacitor 25 to the same point 39 as the anode of diode 37. This would remove the additional resistance from the discharge path of capacitor 25 but would introduce this additional resistance into the capacitor's charging path. A compromise to either of the above arrangements is to connect capacitor 25 to a point 38 intermediate the cathode and the point 39. FIG. 2 shows capacitor 25 connected in this manner. In the circuit of FIG. 2 the impedance in the charging path of capacitor 25 is equal to the impedance in the discharge path thereby providing for equivalent rates of charge and discharge.

The introduction of the diode makes the circuit act alternately as a plate-loaded stage and as a cathode-follower stage with the diode acting as a switch. During the discharge of capacitor 25 when diode 37 is conducting and tube $V_2$ is cut off the circuit acts as a plate-loaded stage. During the charging of capacitor 25 when diode 37 is cut off and tube $V_2$ is conducting the circuit acts as a cathode follower. Thus it will be apparent that an output tap at point 26 will supply, to a relatively high impedance load, a symmetrical voltage wave form due to the uniformity between rates of capacitor charge and discharge.

FIG. 3 is a schematic diagram of a triode high speed flip-flop embodying the concept of the present invention in the plate-to-grid cross couplings. Tubes $V_3$ and $V_4$ are operated in plate-loaded circuits and include plate resistors 53 and 55 connected to a common positive potential $E_2$. Tube $V_5$ is the equivalent of two tubes, having two sets of electrodes, each set being operated in a cathode-follower circuit. The plates of tube $V_5$ are directly connected to a common positive potential $E_1$, and their cathodes are connected through load resistors 49, 51 and additional resistors 57, 59 to a common negative potential $E_3$. In the circuit of FIG. 3 the grids 61 and 63 of tubes $V_3$ and $V_4$ receive input signals at the proper time to cause the tubes to conduct. In order to describe the operation of this circuit it will initially be assumed that tube $V_4$ and the left side of tube $V_5$ are conducting and that capacitor 41 is charging through the left side of $V_5$ to the level of $E_1$. When a positive-going input is applied to the grid 61 of tube $V_3$ it tends to cause $V_3$ to conduct and to drive the plate 69 of $V_3$ in a more negative direction. This negative-going potential is applied to the grid 73 on the left side of tube $V_5$ thereby tending to cut off conduction in the left side of $V_5$. This will allow capacitor 41 to discharge through resistor 43 and tube $V_3$ and to apply a negative-going potential through the lead 65 to the grid 63 of tube $V_4$ thereby tending to cut off $V_4$. This will cause the plate 71 of $V_4$ to assume a more positive potential which is applied through lead 77 to the grid 75 on the right side of tube $V_5$. This will tend to cause conduction in the right side of $V_5$ thereby charging capacitor 45. When a positive-going input pulse is applied to the grid 63 of $V_4$ the cycle will repeat itself in reverse. The tube $V_4$ will start to conduct and its plate 71 will assume a more negative potential. This negative potential will be applied to the grid 75 on the right side of $V_5$ through lead 77 and the right side of tube $V_5$ will tend to cut off. Capacitor 45 will discharge through resistor 47 and tube $V_4$, and apply a negative pulse to the grid 61 of tube $V_3$ through lead 67 thereby cutting off $V_3$. When $V_3$ turns off its plate 69 will go positive and apply this positive potential through lead 79 to grid 73 on the left side of tube $V_5$. The positive potential from plate 69 will turn on the left side of tube $V_5$ and this in turn will cause capacitor 41 to charge, thereby completing a full cycle.

The circuit of FIG. 3 was derived from a standard type flip-flop in which resistors 49 and 51 were connected directly to the plate resistors 53 and 55. The application of the concept of the present invention to this flip-flop, by the inclusion of tube $V_5$ and resistors 43 and 47, results in a substantial improvement in the rate at which the flip-flop can be switched. The disadvantage of capacitive effects which retard the rise in plate voltage after switching is overcome. Additionally, output taps such as leads 54 and 56 at the plate load resistors 53 and 55 will supply substantially rectangular output pulses.

The flip-flop circuit of FIG. 3 incorporating the novel features of this invention was actually operated in a binary counter chain at 500 kc., with a delay in propagation of carries of less than 0.1 μsec. per stage. The component values recorded for this operation are set forth below and are considered as merely exemplary and in no way restrictive.

| | | |
|---|---|---|
| Tubes: | | |
| $V_3$ | | 5965 |
| $V_4$ | | 5965 |
| $V_5$ | | 5965 |
| Resistors: | | |
| **53** | ohms | 30,000 |
| **55** | do | 30,000 |
| **43** | do | 10,000 |
| **47** | do | 10,000 |
| **49** | do | 56,000 |
| **51** | do | 56,000 |
| **57** | do | 36,000 |
| **59** | do | 36,000 |
| Capacitors: | | |
| **41** | μμf | 39 |
| **45** | μμf | 39 |
| Voltages: | | |
| $E_1$ | v | +250 |
| $E_2$ | v | +190 |
| $E_3$ | v | −75 |

Although, in the foregoing, the present invention has been described in terms of electron space discharge devices it is to be understood that their equivalents, i.e. semiconductor devices, could be substituted therefor without departing from the spirit and scope of the invention.

It is to be further understood that the foregoing description is illustrative of the principles of the invention and that many variations and modifications thereof may be devised by those skilled in the art without departing from the scope of the present invention.

What is claimed is:

1. A flip-flop circuit comprising first, second, third and fourth signal translating devices, said third signal translating device being connected to be rendered conductive or nonconductive by said first signal translating device when said first signal translating device is nonconductive or conductive, respectively, said fourth signal translating device being connected to be rendered conductive or nonconductive by said second signal translating device when said second signal translating device is nonconductive or conductive, respectively, input means causing said first and second signal translating devices to be rendered conductive, a first capacitor chargeable through said third signal translating device when said third signal translating device is conducting, a second capacitor chargeable through said fourth signal translating device when said fourth signal translating device is conducting, first circuit means forming a path for said first capacitor to discharge through said first signal translating device when said first signal translating device is conducting, second circuit means forming a path for said second capacitor to discharge through said second signal translating device when said second signal translating device is conducting, third circuit means connecting said first capacitor to said second signal translating device to render said second signal translating device nonconductive when said first capacitor discharges through said first signal translating device, and fourth circuit means connecting said second capacitor to said first signal translating device to render said first signal translating device nonconductive when said second capacitor discharges through said second signal translating device.

2. A flip-flop circuit comprising first and second signal translating devices, a first and second capacitor, first circuit means to charge said first capacitor when said first signal translating device is nonconductive, second circuit means having substantially the same impedance as said first circuit means forming paths for said first capacitor to discharge through said first signal translating device when said first signal translating device is conducting and to render said second signal translating device nonconductive when discharging through said first signal translating device, third circuit means to charge said second capacitor when said second signal translating device is nonconductive, and fourth circuit means having substantially the same impedance as said third circuit means forming paths for said second capacitor to discharge through said second signal translating device when said second signal translating device is conducting and to render said first signal translating device nonconductive when discharging through said second signal translating device.

3. A flip-flop circuit of the character described, comprising: a first plate-loaded signal translating device, a first cathode-follower signal translating device; first circuit means connecting said first plate-loaded signal translating device to said first cathode-follower signal translating device such that when one device is conductive the other is non-conductive; a first capacitor; first circuit connections connecting said capacitor to said first plate-loaded signal translating device and said first cathode-follower signal translating device such that said first capacitor charges through one of said devices when that device is conducting and discharges through the other of said devices when that device is conducting; a second plate-loaded signal translating device; a second cathode-follower signal translating device; second circuit means connecting said second plate-loaded signal translating device to said second cathode-follower signal translating device such that when one device is conductive the other is non-conductive; a second capacitor; second circuit connections connecting said second capacitor to both of said second signal translating devices such that said second capacitor charges through one of said second devices when that device is conductive and discharges through the other of said second devices when that device is conductive; third circuit connections connecting all said signal translating devices such that when said first plate-loaded signal translating device is conductive said second plate-loaded signal translating device is non-conductive and when said first cathode-follower signal translating device is non-conductive said second cathode-follower signal translating device is conductive; and means for applying input pulses to one of said signal translating devices to control the conductivity therein.

4. An electronic circuit comprising: first, second, third and fourth electron control devices each having an anode, a cathode and a control electrode; input means connected to the control electrode of said first and second devices to cause said first and second devices to be rendered alternately conductive and nonconductive at predetermined times; the cathode of said first and second devices being connected to a source of fixed reference potential; first and second impedances arranged in series and connecting the cathode of said third device to a source of negative potential; third and fourth impedances arranged in series and connecting the cathode of said fourth device to said source of negative potential; a first capacitor having one terminal thereof connected to the cathode of said third device and having the other terminal thereof connected between said first and second impedances; a conductor connecting said other terminal of said first capacitor to the control electrode of said second device; a second capacitor having one terminal thereof connected to the cathode of said fourth device and having the other terminal thereof connected between said third and fourth impedances; a conductor connecting said other terminal of said second capacitor to the control electrode of said first device; a fifth impedance connecting the anode of said first device to a first source of positive potential; a sixth impedance connecting the anode of said second device to said first source of positive potential; the anode of said third and fourth devices being connected to a second source of positive potential; a conductor connecting the anode of said first device to the control electrode of said third device; a seventh impedance connecting the anode of said first device to the cathode of said third device; a conductor connecting the anode of said second device to the control electrode of said fourth device; and an eighth impedance connecting the anode of said second device to the cathode of said fourth device.

References Cited by the Examiner

UNITED STATES PATENTS

| | | | |
|---|---|---|---|
| 2,579,633 | 12/51 | Wadzinski | 328—35 X |
| 2,744,169 | 5/56 | Deming | 328—213 X |
| 2,783,314 | 2/57 | Reaves | 320—1 X |
| 2,880,332 | 3/59 | Wanlass | 307—88.5 |
| 2,908,774 | 10/59 | Hals | 328—213 |
| 2,947,949 | 8/60 | Nakamura | 328—200 X |

IRVING L. SRAGOW, *Primary Examiner.*

ORIS L. RADER, *Examiner.*